(12) United States Patent
Gao (10) Patent No.: US 11,653,459 B2
(45) Date of Patent: May 16, 2023

(54) APPARATUS FOR DATA CENTER

(71) Applicant: BAIDU.COM TIMES TECHNOLOGY (BEIJING) CO., LTD., Beijing (CN)

(72) Inventor: Tianyi Gao, Beijing (CN)

(73) Assignee: BAIDU.COM TIMES TECHNOLOGY (BEIJING) CO., LTD., Beijing (CN)

( * ) Notice: Subject to any disclaimer, the term of this patent is extended or adjusted under 35 U.S.C. 154(b) by 115 days.

(21) Appl. No.: 17/479,639

(22) Filed: Sep. 20, 2021

(65) Prior Publication Data
US 2022/0007527 A1 Jan. 6, 2022

(51) Int. Cl.
*H05K 5/02* (2006.01)
*H05K 7/20* (2006.01)
*H05K 7/14* (2006.01)

(52) U.S. Cl.
CPC ......... *H05K 5/0221* (2013.01); *H05K 7/1488* (2013.01); *H05K 7/20763* (2013.01)

(58) Field of Classification Search
CPC ...................................................... H05K 7/00
See application file for complete search history.

(56) References Cited

U.S. PATENT DOCUMENTS

| 2011/0132579 A1* | 6/2011 | Best ......................... H05K 7/20 165/104.31 |
| 2014/0124164 A1* | 5/2014 | Campbell ............ H05K 7/2039 165/45 |

* cited by examiner

*Primary Examiner* — Jerry Wu
(74) *Attorney, Agent, or Firm* — Maschoff Brennan (57) ABSTRACT

A server includes a chassis; a base panel fixedly coupled to the chassis; a movable panel coupled to the base panel; and a locking member fixedly coupled to the movable panel. The movable panel is movable relative to the base panel in a moving direction between an unlocked position where the locking member is configured to be disengaged with a locking panel of an electronic rack, and a locked position where the locking member is configured to be engaged with the locking panel of the electronic rack.

15 Claims, 11 Drawing Sheets

APPARATUS FOR DATA CENTER

FIELD

The present disclosure relates to the field of artificial intelligence, and more particularly to an apparatus for a data center.

BACKGROUND

With the booming of AI applications, high performance computing, cloud computing and data-driven applications, data centers as well as the compute and storage infrastructures have becoming increasingly critical for a company to maintain its competitive edges. Maintaining a data center and compute and storage infrastructure is expensive and part of the expenses is related to cooling the data center.

In the related art, an apparatus for the data center includes a server and an electronic rack. The server is inserted into a server slot of the electronic rack. The server is provided with a liquid cooling assembly therein. The liquid cooling assembly is fluidly coupled to a liquid manifold disposed in the electronic rack, and the liquid manifold is fluidly coupled to external primary loop of the date center, so that cooling liquid can be introduced into the liquid cooling assembly, and warmer liquid can be output from the liquid cooling assembly for cooling of the server.

The liquid cooling assembly in the server is usually coupled to the liquid manifold in the electronic rack through hoses and manual connectors. Hence, connection between the server and the electronic rack may be damaged due to maloperation of a user such as removing the server from the electronic rack without disconnecting the connectors. This may cause a series of damage to the entire electronic rack and adjacent electronic rack.

SUMMARY

Embodiments of the present disclosure seek to solve at least one of the problems existing in the related art to at least some extent.

Embodiments of the present disclosure provide a server. The server includes a chassis, a base panel, a movable panel and a locking member. The base panel is fixedly coupled to the chassis. The movable panel is coupled to the base panel. The locking member is fixedly coupled to the movable panel. The movable panel is movable relative to the base panel in a moving direction between an unlocked position where the locking member is configured to be disengaged with a locking panel of an electronic rack, and a locked position where the locking member is configured to be engaged with the locking panel of the electronic rack.

Embodiments of the present disclosure further provide an electronic rack. The electronic rack includes a server slot and a fixed locking panel. The server slot is configured to receive a server in an extending direction of the server slot. The locking panel is configured to engage with a locking member of the server to prevent the server from being detached from the electronic rack in the extending direction of the server slot.

Embodiments of the present disclosure provide an apparatus for a data center. The apparatus includes a server and an electronic device. The server includes a chassis; a liquid cooling assembly provided in the chassis for liquid cooling of the server; a server connector and a hose, the server connector being fluidly coupled to the liquid cooling assembly through the hose; a base panel fixedly coupled to the chassis and defining a hose channel for passage of the hose; a movable panel coupled to the base panel and movable relative to the base panel in a moving direction; and a locking member fixedly coupled to the movable panel. The server is inserted into the electronic rack in an insertion direction. The electronic rack includes a fixed locking panel and a fixed liquid manifold. The movable panel is movable between an unlocked position where the locking member is disengaged with the locking panel and the second server connector is mounted to the base panel and the movable panel to prevent the movable panel from moving relative to the base panel, and a locked position where the locking member is engaged with the locking panel and the server connector is removed from the base panel and the movable panel and fluidly coupleable to the liquid manifold.

Additional aspects and advantages of embodiments of present disclosure will be given in part in the following descriptions, become apparent in part from the following descriptions, or be learned from the practice of the embodiments of the present disclosure.

BRIEF DESCRIPTION OF THE DRAWINGS

These and other aspects and advantages of embodiments of the present disclosure will become apparent and more readily appreciated from the following descriptions made with reference to the drawings, in which.

DETAILED DESCRIPTION OF THE DISCLOSURE

Various embodiments and aspects of the inventions will be described with reference to details discussed below, and the accompanying drawings will illustrate the various embodiments. The following description and drawings are illustrative of the invention and are not to be construed as limiting the invention. Numerous specific details are described to provide a thorough understanding of various embodiments of the present invention. However, in certain instances, well-known or conventional details are not described in order to provide a concise discussion of embodiments of the present inventions.

Reference in the specification to "one embodiment" or "an embodiment" means that a particular feature, structure, or characteristic described in conjunction with the embodiment can be included in at least one embodiment of the invention. The appearances of the phrase "in one embodiment" in various places in the specification do not necessarily all refer to the same embodiment.

Embodiments of the present disclosure provide an apparatus for a data center. The apparatus includes a server and an electronic device. The server includes a chassis; a liquid cooling assembly provided in the chassis for liquid cooling of the server; a server connector and a hose, the server connector being fluidly coupled to the liquid cooling assembly through the hose; a base panel fixedly coupled to the chassis and defining a hose channel for passage of the hose; a movable panel coupled to the base panel and movable relative to the base panel in a moving direction; and a locking member fixedly coupled to the movable panel. The server is inserted into the electronic rack in an insertion direction. The electronic rack includes a fixed locking panel; and a fixed liquid manifold. The movable panel is movable between an unlocked position where the locking member is disengaged with the locking panel and the second server connector is mounted to the base panel and the movable panel to prevent the movable panel from moving relative to the base panel, and a locked position where the locking member is engaged with the locking panel and the server connector is removed from the base panel and the movable panel and fluidly coupleable to the liquid manifold.

According to embodiments of the present disclosure, when the movable panel is in the unlocked position, the locking member is disengaged with the locking panel and the server connector is mounted to the base panel and the movable panel to prevent the movable panel from moving relative to the base panel, thus the server is allowed to be removed from the electronic rack without any potential damage to the server connector and the hose; when the movable panel is in the locked position, the locking member is engaged with the locking panel and the server connector is removed from the base panel and the movable panel and coupleable to the liquid manifold, thus, the server can be prevented physically from being removed from the electronic rack due to maloperation of a user to avoid potential damage to the server connector and the hose.

In some embodiments, the insertion direction is at an angle to the moving direction of the movable panel. When the insertion direction is parallel to the moving direction of the movable panel, the arrangement of the base and movable panels may interfere with the insertion of the server into the electronic rack. The insertion direction is set not parallel to the moving direction of the movable panel, thus the arrangement of the base and movable panels may be facilitated.

In some embodiments, the insertion direction is perpendicular to the moving direction of the movable panel. The arrangement of the base and movable panels may be further facilitated.

In some embodiments, the server further includes an elastic unit preloaded between the base panel and the movable panel to urge the movable panel to move towards the locking panel relative to the base panel. Once the first and second connectors are released from the base and movable panels, the elastic unit moves the moving panel towards the locking panel to render them to engage with each other. That is, the locking member of the movable panel can automatically move to engage with the locking panel without manual interference. Thus, the arrangement of the base and movable panels has easy and reliable operation without introducing any potential new failure point.

In some embodiments, the elastic unit is pretensioned between an end of the base panel close to the locking panel and an end of the movable panel close to the locking panel. The elastic unit may include a tension spring. Once the first and second connectors are released from the base and movable panels, the elastic unit pulls the moving panel towards the locking panel.

In some embodiments, the elastic unit is precompressed between an end of the base panel away from the locking panel and an end of the movable panel away from the locking panel. The elastic unit may include a compression spring. Once the first and second connectors are released from the base and movable panels, the elastic unit pushes the moving panel towards the locking panel.

It could be understood that, in some other embodiments, two elastic units may be provided, one elastic unit is pretensioned between an end of the base panel close to the locking panel and an end of the movable panel close to the locking panel, and the other is precompressed between an end of the base panel away from the locking panel and an end of the movable panel away from the locking panel.

In some embodiments, the locking member includes an engagement plate fixedly coupled to the end of the movable panel close to the locking panel. Thus, the locking member has a simple structure and easy to manufacture.

In some embodiments, the locking member further includes a reinforcing rib fixedly coupled to the engagement plate. Thus, the strength of the locking member is enhanced.

In some embodiments, the two reinforcing ribs are provided, and the two reinforcing ribs extend in the moving direction and spaced apart from each other transversely to the moving direction. Thus, the strength of the locking member is further enhanced.

In some embodiments, the locking panel defines a receiving groove, and when in the locked position, the locking member is received in the receiving groove to prevent the server from being detached from the electronic rack. Thus, the structure of the locking panel is simple, facilitating the engagement of the locking panel and the locking member.

In some embodiments, the locking panel is fixedly coupled to the liquid manifold. Thus, the locking panel is provided in the electronic rack through the liquid manifold, and the infrastructure of the electronic rack of a conventional electronic rack does not need any modification.

In some embodiments, the locking panel includes a first sub-panel coupled to the liquid manifold and a second sub-panel fixedly coupled to an edge of the first sub-panel and is spaced apart from the liquid manifold to define the receiving groove. Thus, the locking panel has a simple structure and easy to manufacture.

In some embodiments, the first sub-panel and the second sub-panel are each a flat plate and perpendicular to each other. The first and second sub-panels can be formed by welding two flat plates or bending one flat plate.

In some embodiments, the locking panel facing towards the insertion direction, and when in the locked position the locking panel is located between the locking member and the server chasis, the locking member is blocked by the locking panel to prevent the server from being detached from the electronic rack in the insertion direction. Thus, the structure of the locking panel can be further simplified.

In some embodiments, the locking panel facing towards the moving direction of the movable panel, the locking panel defines a receiving hole, and the locking member includes a pin, and when in the locked position, the pin is received in the receiving hole. Other suitable structures of the locking panel and locking member can be envisaged, as long as the locking panel and the locking member can be engaged to prevent the server from being removed from the front side of the electronic rack.

In some embodiments, the electronic rack defines a server slot, and the server is inserted into the server slot in an extending direction of the server slot. It could be understood that the extending direction of the server slot is the insertion direction when the servers are being populated to the electronic rack.

Embodiments of the present disclosure further provide an apparatus for a data center. The apparatus includes a server and an electronic rack. The server includes a chassis; a liquid cooling assembly provided in the chassis for liquid cooling of the server and having an inlet and an outlet; a first server connector and a first hose, the first server connector being coupled to the inlet of the liquid cooling assembly through the first hose; a second server connector and a second hose, the second server connector being coupled to the outlet of the liquid cooling assembly through the second hose; a base panel fixedly coupled to the chassis, the base panel defining a first hose channel and a second hose channel for passage of the first hose and the second hose respectively; a movable panel coupled to the base panel and is movable relative to the base panel in a moving direction, and a locking member fixedly coupled to the movable panel. The electronic rack defines a server slot, the server being inserted into the server slot in an extending direction of the server slot; a fixed locking panel; and a fixed liquid manifold comprising a supply manifold to supply cooling liquid to the liquid cooling assembly and a return manifold to return warmer liquid from the liquid cooling assembly. The movable panel is movable between a unlocked position where the locking member is disengaged with the locking panel and the first and second server connectors are mounted to the base panel and the movable panel to prevent the movable panel from moving relative to the base panel, and a locked position where the locking member is engaged with the locking panel and the first and second server connectors are removed from the base panel and the movable panel and coupleable to the supply manifold and the return manifold respectively.

According to embodiments of the present disclosure, when the movable panel is in the unlocked position, the locking member is disengaged with the locking panel and the first and second server connectors are mounted to the base panel and the movable panel to prevent the movable panel from moving relative to the base panel, thus the server is allowed to be removed from the electronic rack without any potential damage to the first and second server connectors as well as the first and second hoses; when the movable panel is in the locked position, the locking member is engaged with the locking panel and the first and second server connectors are removed from the base panel and the movable panel and coupleable to the supply manifold and the return manifold respectively, thus, the server can be physically prevented from being removed from the electronic rack due to maloperation of a user to avoid potential damage to the first and second server connectors as well as the first and second hoses.

In some embodiments, the server further includes a first connector holder and a second connector holder provided on the base panel, and a third connector holder and a fourth connector holder provided on the movable panel; when in the unlocked position, the first connector holder corresponds in position to the third connector holder, and the first server connector is mounted to both of the first connection holder and the third connector holder, and the second server connector is mounted to both of the second connection holder and the fourth connector holder to lock the movable panel and the base panel together. Thus, the first and second server connectors can be easily and stably mounted to the base and movable panels to prevent the movable panel from moving relative to the base panel.

In some embodiments, the first connector holder is provided at the first hose channel, the second connector holder is provided at the second hose channel, and the third and fourth connector holders are provided at an end of the movable panel away from the locking panel. Thus, the structure of the movable panel is simple and easy to manufacture.

In some embodiments, the movable panel defines a first hole corresponding in position to the first hose channel and a second hole corresponding in position to the second hose channel, the first server connector and the first hose pass through the first hose channel and the first hole sequentially, and the second server connector and the second hose pass through the second hose channel and the second hole sequentially. Thus, when the movable panel moves towards the locking panel, the first and second hoses will move along the first and second hose channels respectively.

In some embodiments, the first connector holder is provided at the first hose channel, the second connector holder is provided at the second hose channel, the third connector holder is provided at the first hole, and the fourth connector holder is provided at the second hole. Thus, when the first and second server connectors are mounted to the first through fourth connector holders, the first and second server connectors as well as the first and second hoses can be accommodated in the first and second holes and the first and second hose channels. That is, the first and second server connectors as well as the first and second hoses can be well protected by the base and movable panels.

It could be understood that, in some other embodiments, the first hole and the second hole may serve as the third and fourth connector holders. That is, the first and second hole in the movable panel may be used to hold the first and second server connectors directly. In this case, the third and fourth connector holders may be omitted to simplify the structure.

In some embodiments, the first connector holder is provided at an end of the first hose channel away from the locking panel, and the second connector holder is provided at an end of the second hose channel away from the locking panel. Thus, lengths of the first and second hose channels can be fully utilized, and the base and movable panels can be shortened to save materials.

It could be understood that, in some other embodiments, the movable panel defines a third hose channel corresponding in position to the first hose channel and a fourth hose channel corresponding in position to the second hose channel, the first server connector and the first hose pass through the first hose channel and the third hose channel sequentially, and the second server connector and the second hose pass through the second hose channel and the fourth hose channel sequentially. Thus, when the movable panel moves towards the locking panel, the first and second hoses will move along the first through fourth hose channels respectively.

In some embodiments, each of the first through fourth connector holders is provided with a treaded edge, to better assist the operation and protect the first and second hoses.

The above description does not include an exhaustive list of all embodiments in this disclosure. All systems and methods can be practiced from all suitable combinations of the various aspects and embodiments described in the disclosure.

The following description and drawings are illustrative and are not to be construed as limiting. Numerous specific details are described to provide a thorough understanding of various embodiments. However, in certain instances, well-known or conventional details are not described in order to provide a concise discussion of embodiments.

An apparatus 1000 for a data center according to a first embodiment of the present disclosure will be described in detail below. With reference to FIGS. 1 to 10, the apparatus 1000 includes a server 100 and an electronic rack 200.

Figure 1:
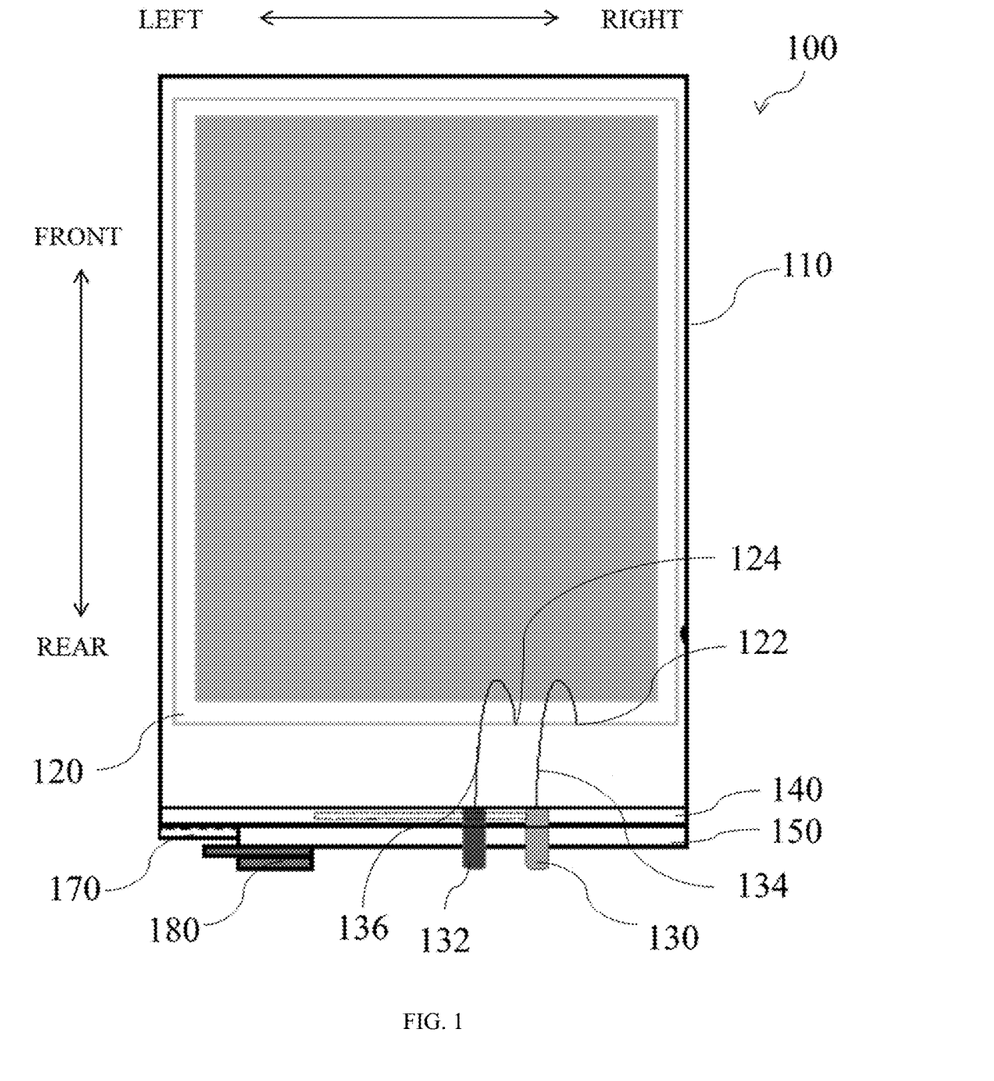
FIG. 1 is a schematic top view of an apparatus for a data center according to a first embodiment of the present disclosure.

As illustrated in FIG. 1, the server 100 includes a chassis 110, a liquid cooling assembly 120, the cooling assembly can be understood as a liquid cooling module for the server, a first server connector 130, a second server connector 132, a first hose 134 and a second hose 136.

The chassis 110 has a substantially box shape. The liquid cooling assembly 120 is provided in the chassis 110 and configured for liquid cooling of the server 100. The liquid cooling assembly 120 has an inlet 122 for introducing cooling liquid, and an outlet 124 for outputting warmer liquid. The inlet 122 and the outlet 124 are provided at a rear end of the liquid cooling assembly 120.

The first server connector 130 is fluidly coupled to the inlet 122 of the liquid cooling assembly 120 through the first hose 134, and the second server connector 132 is fluidly coupled to the outlet 124 of the liquid cooling assembly 120 through the second hose 136. The first server connector 130 and the first hose 134 are used to introduce cooling liquid into the liquid cooling assembly 120, and the second server connector 132 and the second hose 136 are used to output warmer liquid from the liquid cooling assembly 120.

The server 100 also includes a base panel 140 and a movable panel 150 coupled to the base panel 140. The base panel 140 and the movable panel 150 are located at a rear end of the chassis 110. The base panel 140 is fixedly coupled to the chassis 110. The movable panel 150 is coupled to the base panel 140 and is movable relative to the base panel 140 in a moving direction (e.g., a left-right direction as illustrated in FIG. 1).

Figure 2:
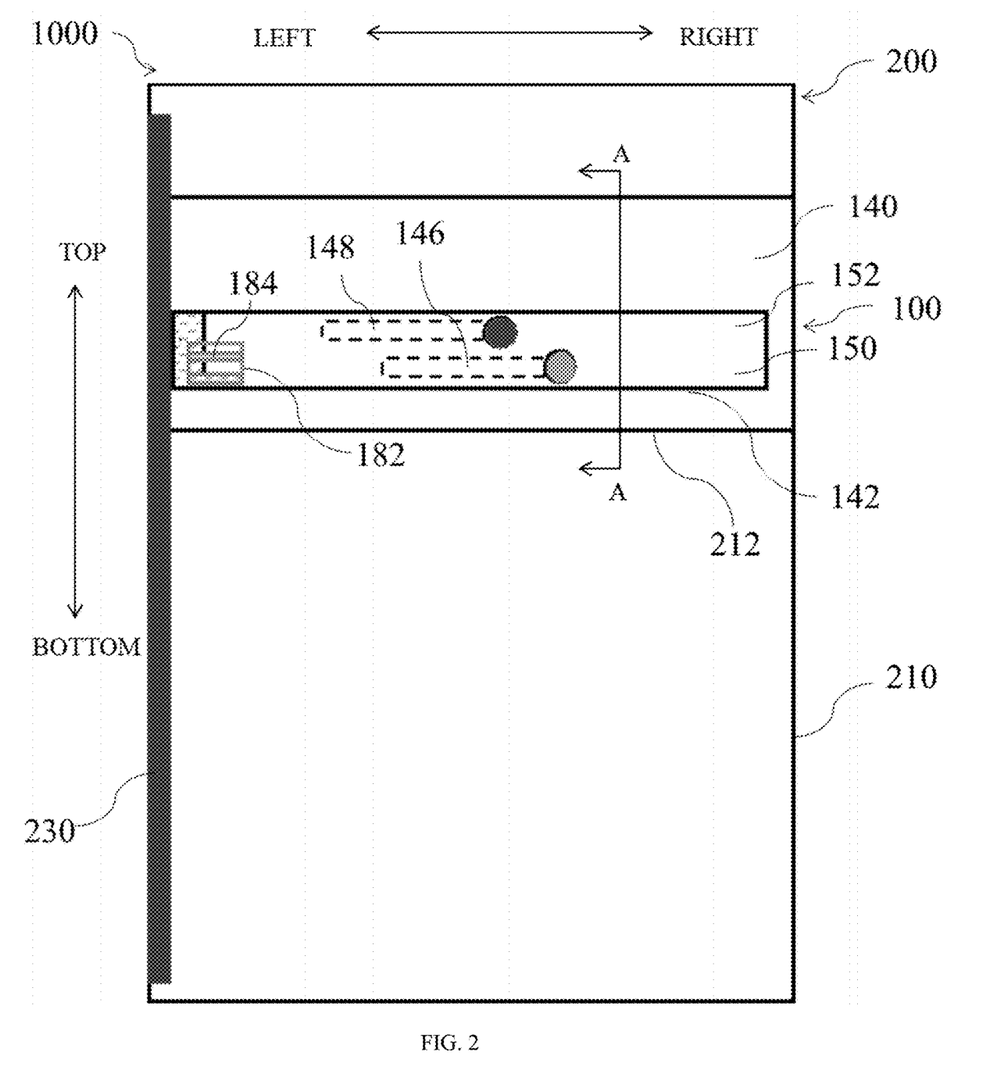
FIG. 2 is a schematic rear view of an apparatus for a data center according to a first embodiment of the present disclosure, where a movable panel is in an unlocked position.

As illustrated in FIG. 2, the base panel 140 has a substantially rectangular shape, and defines a guiding groove 142 extending in the left-right direction. The movable panel 150 has a substantially rectangular shape, is received in the guiding groove 142, and is slidable in an extending direction of the guiding groove 142, i.e., the left-right direction as illustrated in FIG. 2. The guiding groove 142 has a substantially rectangular shape.

Figure 3:
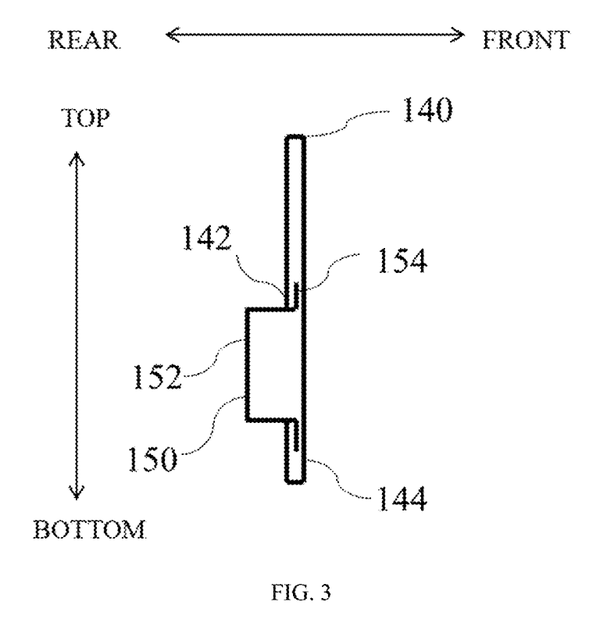
FIG. 3 is a schematic cross-sectional view of a base panel and a movable panel of the apparatus illustrated in FIG. 2 taken along line A-A.

FIG. 3 is a schematic cross-sectional view of a base panel and a movable panel of the apparatus illustrated in FIG. 2 taken along line A-A. For conciseness and clarity, only the base panel and the movable panel are shown in FIG. 3, other components such as the locking member are omitted. As illustrated in FIG. 3, a body 152 of the movable panel 150 has a substantially U-shaped cross section and is received in the guiding groove 142, and a width of the guiding groove 142 in the top-bottom direction is substantially the same as a width of the body 152 of the movable panel 150 in the top-bottom direction. Thus, the movable panel 150 and the base panel 140 are fixed in the top-bottom direction. That is, the movable panel 150 cannot be moved in the top-bottom direction relative to the base panel 140. Additionally, the body 152 of the movable panel 150 protrudes rearwards from a rear surface of the base panel 140, to assist the manual operation to move the movable panel 150 relative to the base panel 140 in the left-right direction. The base panel 140 further defines two guiding slots 144 in two opposite groove walls of the guiding groove 142 in the top-bottom direction, and the two guiding slots 144 extend in the left-right direction. The movable panel 150 includes two flanges 154 oppositely extending from front edges of the body 152 of the movable panel 150 in the top-bottom direction. The two flanges 154 of the movable panel 150 are fitted in the two guiding slots 144 of the base panel 140, and the movable panel 150 and the base panel 140 are fixed in the front-rear direction. That is, the movable panel 150 cannot be moved in the front-rear direction relative to the base panel 140.

Figure 4:
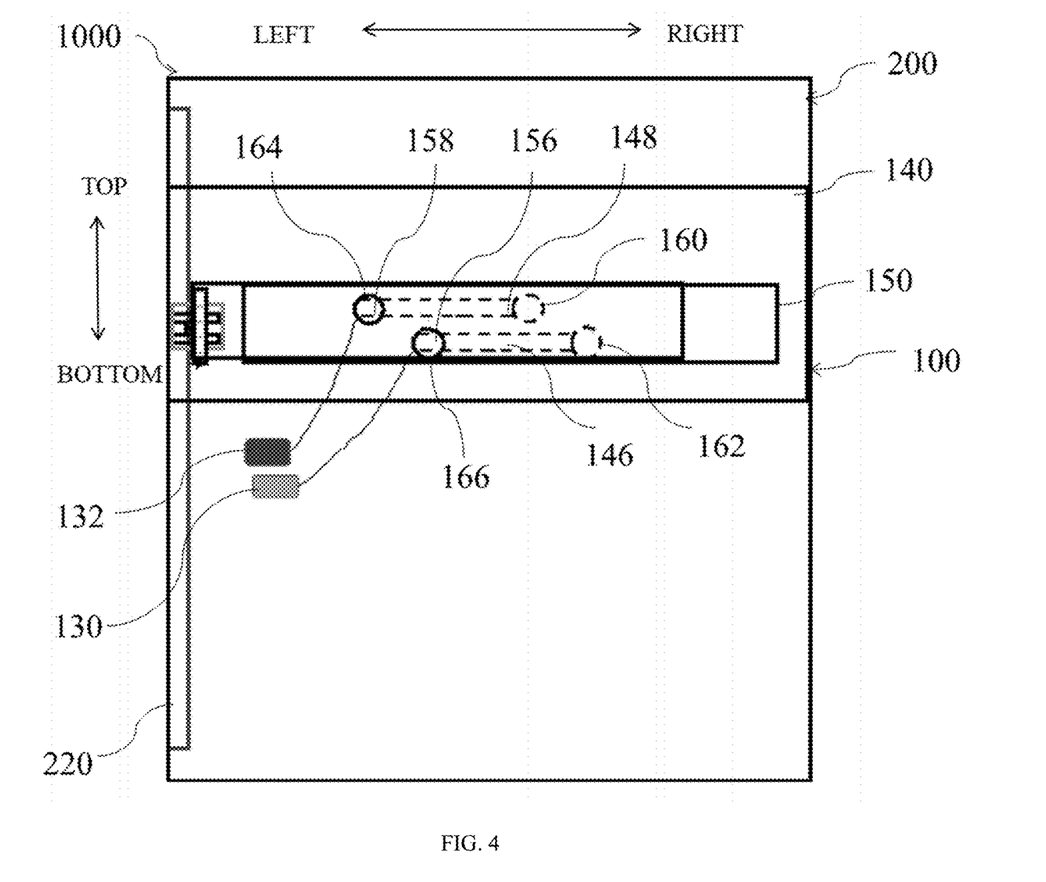
FIG. 4 is another schematic rear view of an apparatus for a data center according to a first embodiment of the present disclosure, where a movable panel is in a locked position.

As illustrated in FIGS. 2 and 4, the base panel 140 defines a first hose channel 146 and a second hose channel 148. The first hose channel 146 and the second hose channel 148 extend in the left-rear direction. As illustrated in FIG. 4, the movable panel 150 defines a first hole 156 and a second hole 158. Both the first hole 156 and the second hole 158 are circular in shape. The first hose channel 146 corresponds in position to the first hole 156 in the front-rear direction, and the second hose channel 148 corresponds in position to the second hole 158 in the front-rear direction. Widths of the first and second hose channels 146, 148 in the top-bottom direction are equal to or greater than outer diameters of the first and second hoses 134, 136 and outer diameters of the first and second server connectors 130, 132, and inner diameters of the first and second holes 156, 158 are equal to or greater than widths of the first and second hose channels 146, 148 in the top-bottom direction. The first server connector 130 and thus the first hose 134 may pass through the first hose channel 146 and the first hole 156 sequentially, and the first hose 134 can move along the first hose channel 146 smoothly. The second server connector 132 and thus the second hose 136 may pass through the second hose channel 148 and the second hole 158 sequentially, and the second hose 136 can move along the second hose channel 148 smoothly.

The server 100 includes a first connector holder 160 fixed at the first hose channel 146 and a second connector holder 162 fixed at the second hose channel 148. As illustrated in FIGS. 2 and 4, the first connector holder 160 is fixed in the first hose channel 146 and located at a right end of the first hose channel 146, and the second connector holder 162 is fixed in the second hose channel 148 and located at a right end of the second hose channel 148. The movable panel 150 includes a third connector holder 164 fixed at the first hole 156, and a fourth connector holder 166 fixed at the second hole 158. As illustrated in FIGS. 2 and 4, the third connector holder 164 is fixed in the first hole 156, and the fourth connector holder 166 is fixed in the second hole 158.

As illustrated in FIG. 2, when the first and second server connectors 130, 132 are mounted to the base panel 140 and the movable panel 150, the first server connector 130 is received in the first hole 156 and the first hose channel 146 and secured to both of the first connector holder 160 on the base panel 140 and the third connector holder 164 on the movable panel 150; the second server connector 132 is received in the second hole 158 and the second hose channel 148 and secured to both of the second connector holder 162 on the base panel 140 and the fourth connector holder 166 on the movable panel 150. Thus, the movable panel 150 is prevented from moving relative to the base panel 140. That is, the movable panel 150 and base panel 140 are locked together by the first and second server connectors 130, 132. The first or second server connectors 130, 132 can be respectively secured to the first and third connector holders 160, 164 or the second and fourth connector holders 162, 166 by snap-fit connection, threaded connection or any other suitable connections.

As illustrated in FIG. 4, when the first and second server connectors 130, 132 are both removed from the base panel 140 and the movable panel 150, the movable panel 150 may move relative to the base panel 140 in the moving direction automatically, and the first and second hoses 134, 136 can also move along the first and second hose channels 146, 148 in the base panel 140 in the moving direction smoothly.

As illustrated in FIGS. 2 and 4, lengths of the first and second hose channels 146, 148 in the left-right direction are substantially the same, and the first and second hose channels 146, 148 are spaced apart in the top-bottom direction. Furthermore, the first and second hose channels 146, 148 are staggered in the top-bottom direction. That is, projections of the first and second hose channels 146, 148 onto the same plane in the top-bottom direction are partially overlapped. Thus, the first and second server connectors 130, 132 can mounted to and removed from the first through fourth connector holders 160, 162, 164, 166 conveniently without interference, and movement of the first hose 134 along the first hose channel 146 does not interfere with movement of the second hose 136 along the second hose channel 148.

As illustrated in FIGS. 1, 2 and 4, the server 100 includes an elastic unit 170 preloaded between the base panel 140 and the movable panel 150. The elastic unit 170 urges the movable panel 150 to move relative to the base panel 140. As illustrated in FIG. 1, the elastic unit 170 is provided between a left end of the base panel 140 and a left end of the movable panel 150. When the first and second server connectors 130, 132 are mounted to the base panel 140 and the movable panel 150, the elastic unit 170 is pretensioned between the left end of the base panel 140 and the left end of the movable panel 150. Thus, when the first and second server connectors 130, 132 are removed from the base panel 140 and the movable panel 150, the movable panel 150 is urged to move leftwards relative to the base panel 140. The elastic unit 170 may include a tension spring.

As illustrated in FIGS. 1, 2 and 4, the server 100 includes a locking member 180 provided at the left end of the movable panel 150. The locking member 180 includes an engagement plate 182 fixedly coupled to the left end of the movable panel 150 and two reinforcing ribs 184 fixedly coupled to the engagement plate 182. The engagement plate 182 is a rectangular flat plate. The two reinforcing ribs 184 extend in the left-right direction and are spaced apart from each other in the top-bottom direction.

Figure 5:
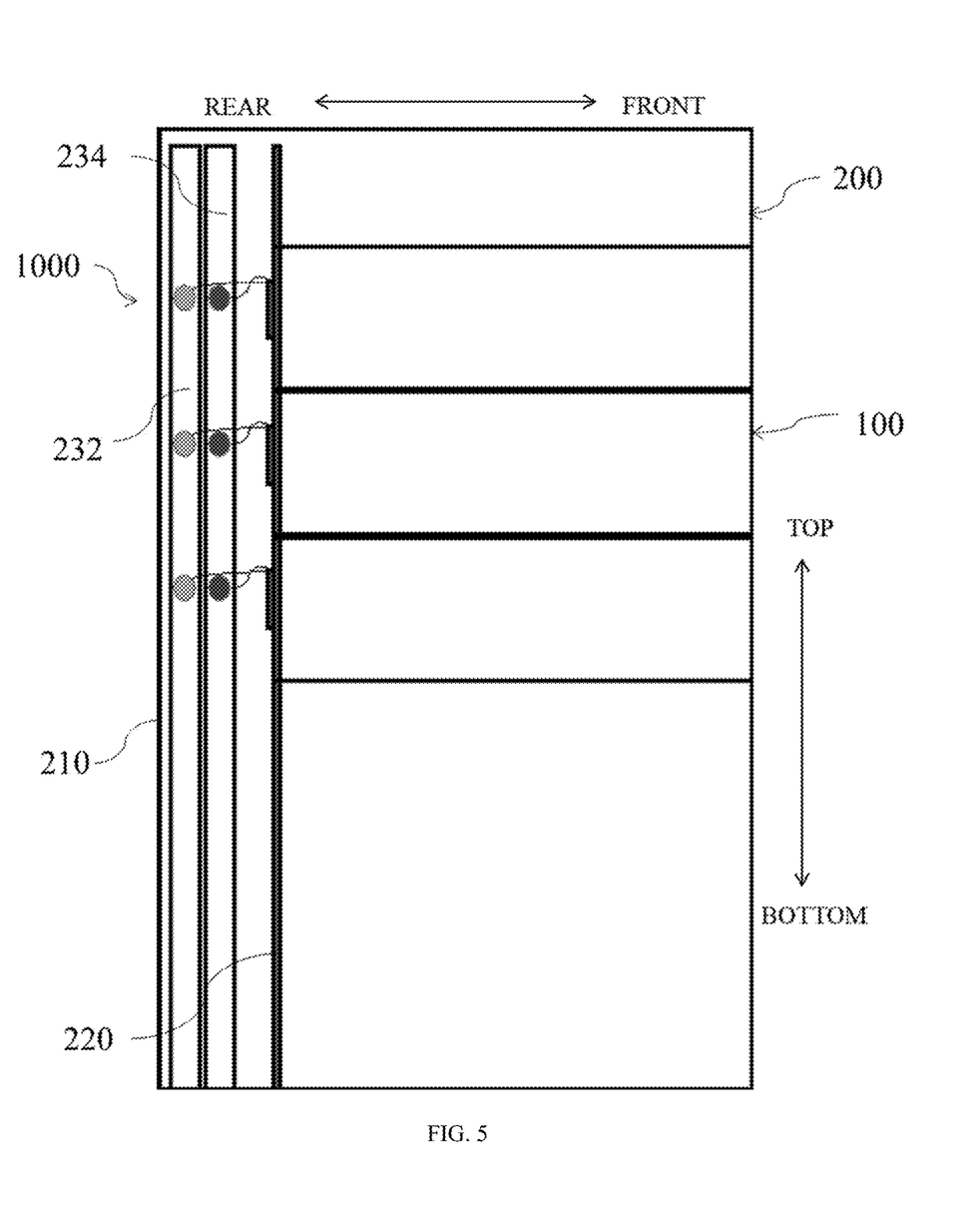
FIG. 5 is a schematic side view of an apparatus for a data center according to a first embodiment of the present disclosure.

As illustrated in FIGS. 2, 4 and 5, the electronic rack 200 includes an IT space 210, a locking panel 220 and a liquid manifold 230.

The IT space 210 includes a server slot 212 extending in the front-rear direction. The server 100 is inserted into the server slot 212 from a front side of the IT space 210.

Figure 6:
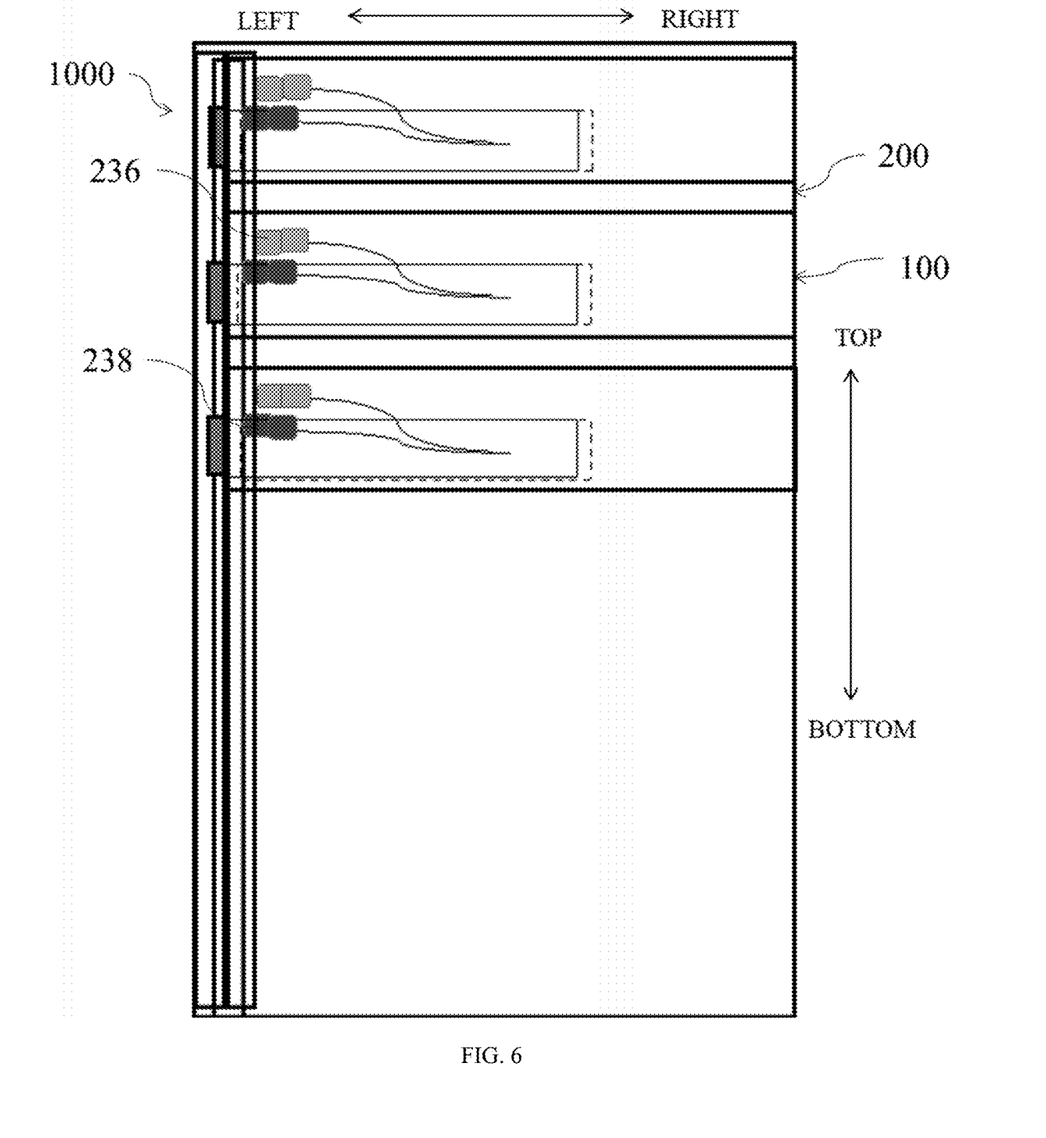
FIG. 6 is a yet another schematic rear view of an apparatus for a data center according to a first embodiment of the present disclosure.

The liquid manifold 230 is fixedly provided in the IT space 210. As illustrated in FIG. 5, the liquid manifold 230 extends in a top-bottom direction and is provided at the rear left corner of the IT space 210. The liquid manifold 230 includes a supply manifold 232 to supply cooling liquid to the liquid cooling assembly 120 and a return manifold 234 to return warmer liquid from the liquid cooling assembly 120. As illustrated in FIG. 6, the supply manifold 232 is provided with a first manifold connector 236, and the return manifold 234 is provided with a second manifold connector 238. The liquid cooling assembly 120 may be coupled to the liquid manifold 230 by mating the first server connector 130 with the first manifold connector 236 and mating with the second server connector 132 with the second manifold connector 238.

The locking panel 220 is fixedly provided in the IT space 210. As illustrated in FIG. 4, the locking panel 220 is an elongated flat panel extending in the top-bottom direction, and provided at a rear left corner of the IT space 210. The locking member 180 may be engaged with the locking panel 220 to prevent the server 100 from being uninstalled from the front side of the electronic rack 200. It needs to be noted that the locking member 180 is engaged with the locking panel 220 before the first and second server connectors 130, 1320 are connected to the liquid manifold 230.

The movable panel 150 is movable between a unlocked position where the locking member 180 is disengaged with the locking panel 220 and the first and second server connectors 130, 132 are mounted to the base panel 140 and the movable panel 150 to prevent the movable panel 150 from moving relative to the base panel 140 in the left-rear direction, and a locked position where the locking member 180 is engaged with the locking panel 220 and the first and second server connectors 130, 132 are removed from the base panel 140 and the movable panel 150 and coupleable to the supply manifold 232 and the return manifold 234 respectively.

As illustrated in FIG. 4, when the first and second server connectors 130, 132 are removed from the base panel 140 and the movable panel 150, the movable panel 150 is urged to move leftwards towards the locking panel 220 relative to the base panel 140 by the elastic unit 170, and the locking member 180 can be engaged with the locking panel 220. Under the action of the elastic unit 170, the locking member can be engaged with the locking panel 220 automatically. Furthermore, the first and second server connectors 130, 132 need to be coupled to the first and second manifold connectors 236, 238 manually. This ensures that the locking member 180 is engaged with the locking panel 220 before the first and second server connectors 130, 1320 are connected to the liquid manifold 230, to further avoid damage to the connectors and hoses due to maloperation.

Since the locking member 180 is engaged with the locking panel 220, when the server 100 is being attempted to be removed from the front side of the electronic rack 200 in the front-rear direction, the locking member 180 are stopped by the locking panel 220. The locking member 180 is fixedly coupled to the movable panel 150, the movable panel 150 is fixed relative to the base panel 140 in the front-rear direction, and the base panel 140 is fixedly coupled to the chassis 110. Thus, the server 100 is prevented from being uninstalled from the front side of the electronic rack 200.

FIG. 5 is a schematic side view of an apparatus 1000 for a data center according to a first embodiment of the present disclosure. FIG. 6 is a yet another schematic rear view of an apparatus for a data center according to a first embodiment of the present disclosure. As illustrated in FIGS. 5 and 6, the first server connector 130 is coupled to the supply manifold 232 through the first manifold connector 236, and the second server connector 132 is coupled to the return manifold 234 through the second manifold connector 238, when the movable panel 150 is in the locked position.

Figure 7:
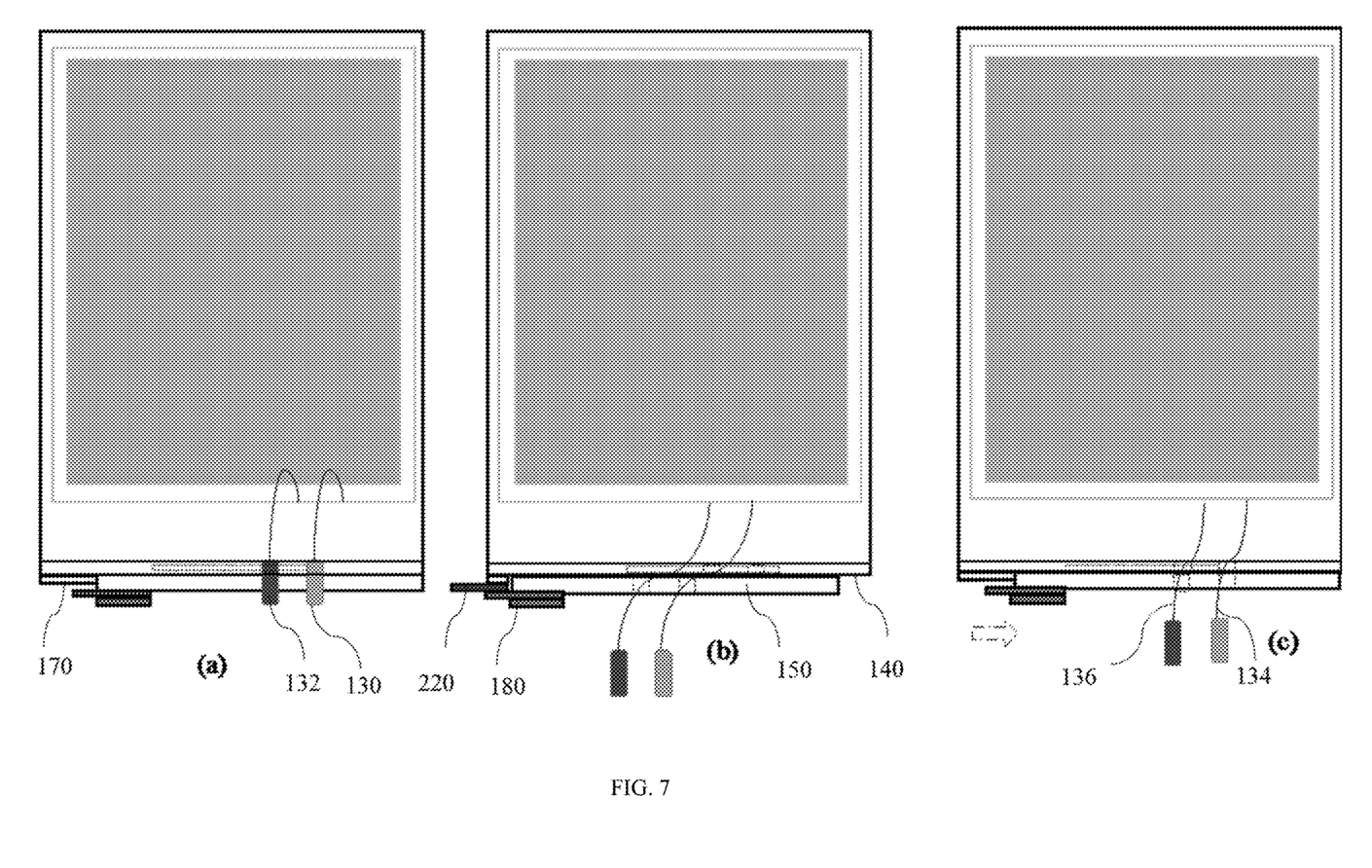
FIG. 7 illustrates an operation of an apparatus for a data center according to a first embodiment of the present disclosure, viewing from the top.

FIG. 7 shows the operation of the apparatus 1000 according to the first embodiment of the present disclosure. FIG. 7a shows the server 100 is inserted into the electronic rack 200 and the first and second server connectors 130, 132 are mounted to the server 100, and FIG. 7b shows the first and second server connectors 130, 132 are released from the server 100 and the locking member 180 is engaged with the locking panel 220. This means once the first and second server connectors 130, 132 are released from the base and movable panels 140, 150, and the server 100 is mechanically locked with the electronic rack 200. FIG. 7c shows that manual operation is required to push the movable panel 150 back to an original position relative to the base panel 140, and the locking member 180 is disengaged with the locking panel 220. The manual operation is highly desired for better ensuring the safety operation of the system. Since only when the first and second server connectors 130, 132 are inserted to first and second connector holders 160 and 162, the movable panel 150 is fully locked with the base panel 140. The movable panel 150 is fixed at the unlocked position when the first and second server connectors 130, 132 are mounted back to the original location in FIG. 7a. It can be seen that the apparatus 1000 according to the first embodiment of the present disclosure provides an advanced structure to protect the connections between the liquid cooling assembly 120 of the server 100 and the liquid manifold 230 of the electronic rack 200.

Figure 8:
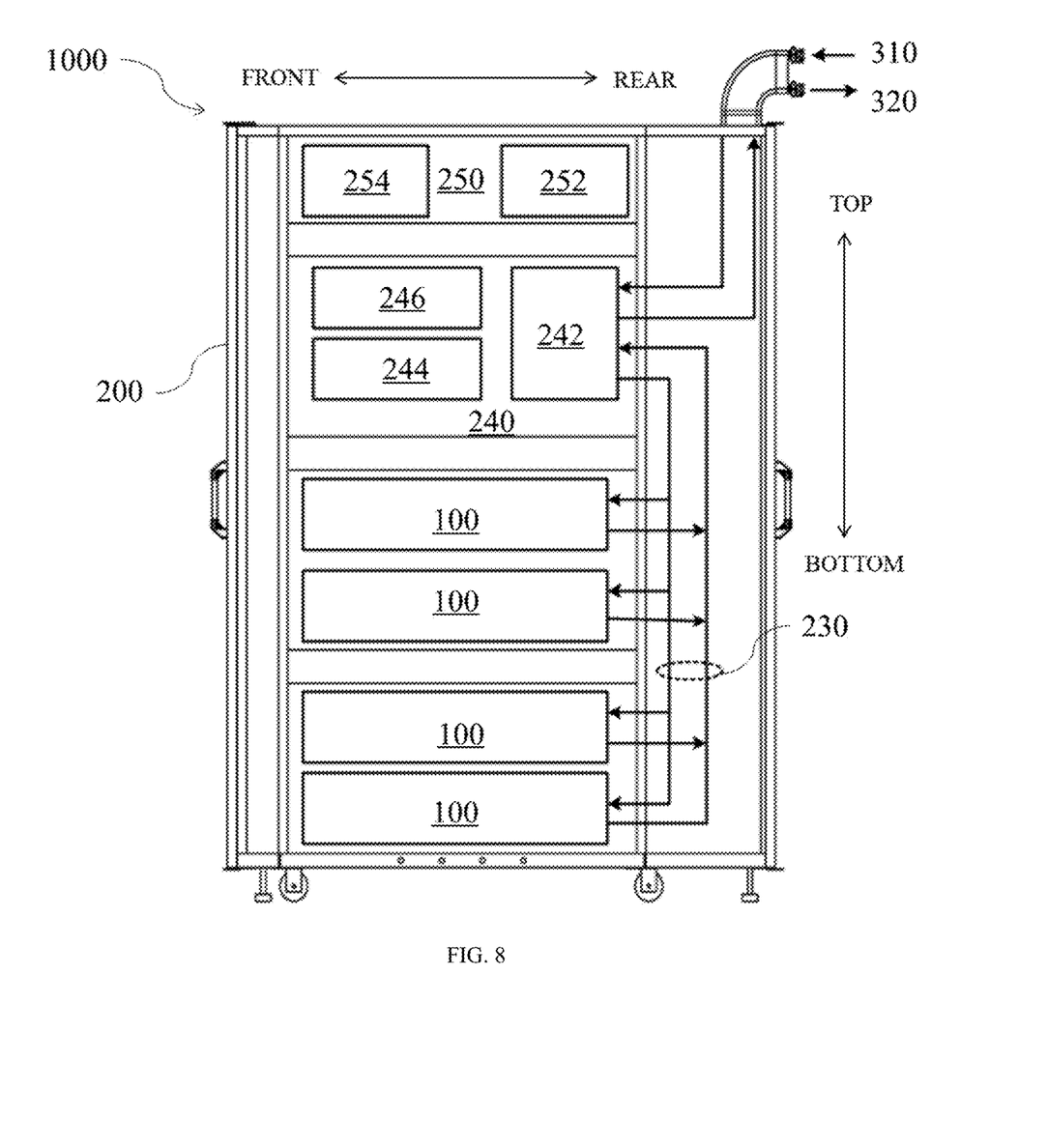
FIG. 8 is another schematic side view of an apparatus for a data center according to a first embodiment of the present disclosure.

FIG. 8 is a block diagram illustrating a side view of the apparatus 1000 according to the first embodiment of the present disclosure, which is a type of IT container commonly used in data centers. The electronic rack 200 includes a coolant distribution unit (CDU) 240, a rack management unit (RMU) 250. The IT space 210 includes an array of server slots 212, a plurality of servers 100 can be inserted into the array of server slots 212 respectively. Note that although only four servers 100 are shown, more or fewer servers 100 can be maintained within electronic rack 200. Also note that the particular positions of CDU 240, CMU 250, and servers 100 are shown for the purpose of illustration only; other arrangements or configurations of CDU 240, CMU 250, and servers 100 can also be implemented. Further, the front door disposed on front side and the back door disposed on rear side are optional. In some embodiments, there can no door on front side and/or rear side.

In one embodiment, CDU 240 includes a heat exchanger 242, a liquid pump 244, and a pump controller 246. Heat exchanger 242 can be a liquid-to-liquid heat exchanger. Heat exchanger 242 includes a first tube having a first pair of liquid connectors coupled to external liquid supply/return lines 310-320 to form a primary loop, where the connectors coupled to the external liquid supply/return lines 310-320 can be disposed or mounted on the rear end of electronic rack 200. In addition, the heat exchanger 242 further includes a second tube having a second pair of liquid connectors coupled to liquid manifold 230.

Each server 100 can include one or more IT components (e.g., CPUs, GPUs, memory, and/or storage devices). Each IT component can perform data processing tasks, where the IT component can include software installed in a storage device, loaded into the memory, and executed by one or more processors to perform the data processing tasks. Server 100 can include a host server (referred to as a host node) coupled to one or more compute servers (also referred to as compute nodes). The host server (having one or more CPUs) typically interfaces with clients over a network (e.g., Internet) to receive a request for a particular service such as storage services (e.g., cloud-based storage services such as backup and/or restoration), executing an application to perform certain operations (e.g., image processing, deep data learning algorithms or modeling, etc., as a part of a software-as-a-service or SaaS platform). In response to the request, the host server distributes the tasks to one or more of the compute servers (having one or more GPUs) managed by the host server. The compute servers perform the actual tasks, which can generate heat during the operations.

The liquid cooling assembly 120 includes cold plates. The processors can be mounted on the cold plates, where the cold plates include a liquid distribution channel embedded therein to receive the cooling liquid from the liquid manifold 230 and to return the cooling liquid carrying the heat exchanged from the processors back to the liquid manifold 230.

The RMU 250 configured to provide and manage power supplied to servers 100 and CDU 240. RMU 250 can be coupled to a power supply unit (not shown) to manage the power consumption of the power supply unit, as well as other thermal management of the power supply unit (e.g., cooling fans). The power supply unit can include the necessary circuitry (e.g., an alternating current (AC) to direct current (DC) or DC to DC power converter, battery, transformer, or regulator, etc.) to provide power to the rest of the components of electronic rack 200.

In one embodiment, RMU 250 includes an optimal control logic 252 and a rack management controller (RMC) 254. The optimal control logic 252 is coupled to at least some of servers 100 to receive operating status of each of the servers 100, such as processor temperatures of the processors, the current pump speed of the liquid pump 244, and liquid temperature of the cooling liquid, etc. Based on this information, optimal control logic 252 determines an optimal pump speed of the liquid pump 244 by optimizing a predetermined objective function, such that the output of the objective function reaches the maximum while a set of predetermined constraints is satisfied. Based on the optimal pump speed, RMC 254 is configured to send a signal to pump controller 246 to control the pump speed of liquid pump 244 based on the optimal pump speed.

Figure 9:
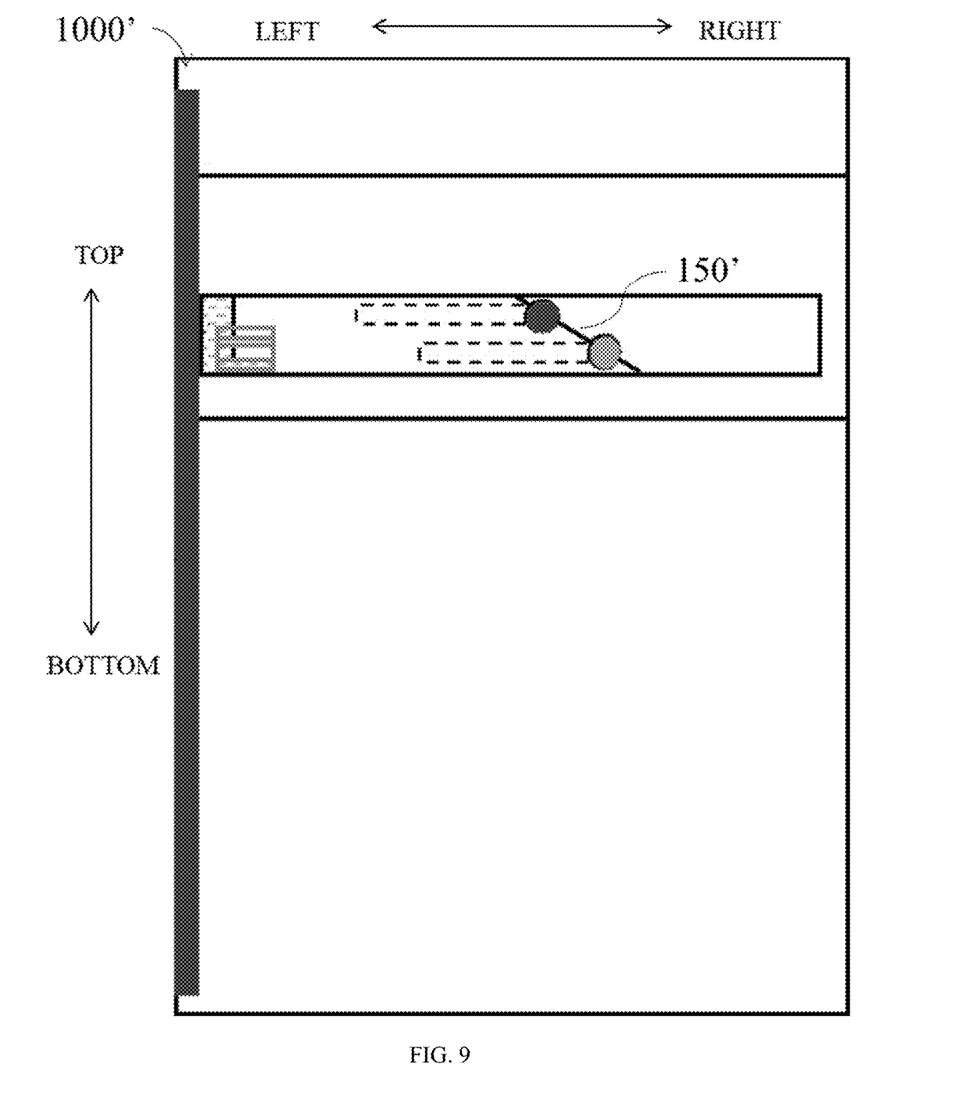
FIG. 9 is a schematic rear view of an apparatus for a data center according to a second embodiment of the present disclosure, where a movable panel is in an unlocked position.
Figure 10:
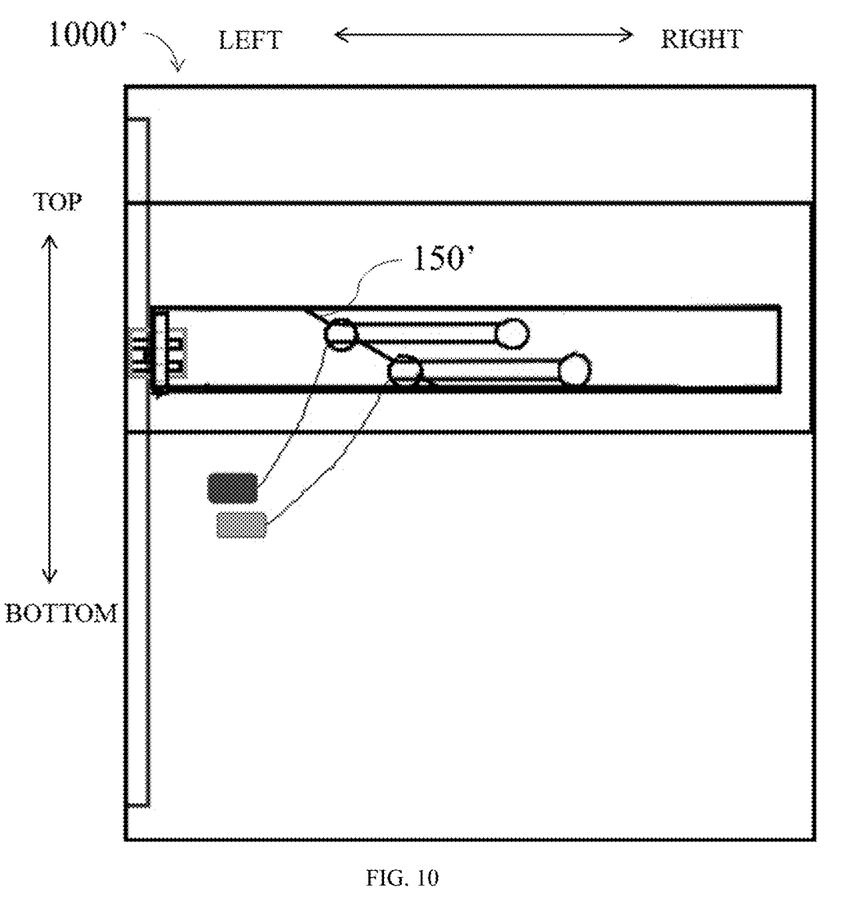
FIG. 10 is another schematic rear view of an apparatus for a data center according to a second embodiment of the present disclosure, where a movable panel is in a locked position.

An apparatus 1000' for a data center according to a second embodiment of the present disclosure will be described in detail below. With reference to FIGS. 9 and 10, the apparatus 1000' has substantially the same structure as the apparatus 1000 according to the first embodiment of the present disclosure, and differs from the apparatus 1000 in a modified movable panel 150'. As illustrate in FIGS. 9 and 10, the movable panel 150' has a substantially right-angle trapezoidal shape, the right end of movable panel 150' is inclined, and the third and fourth connector holders 164, 166 are provided at the right end of the movable panel 150'. The movable panel 150' according to this embodiment can save the material and costs.

Figure 11:
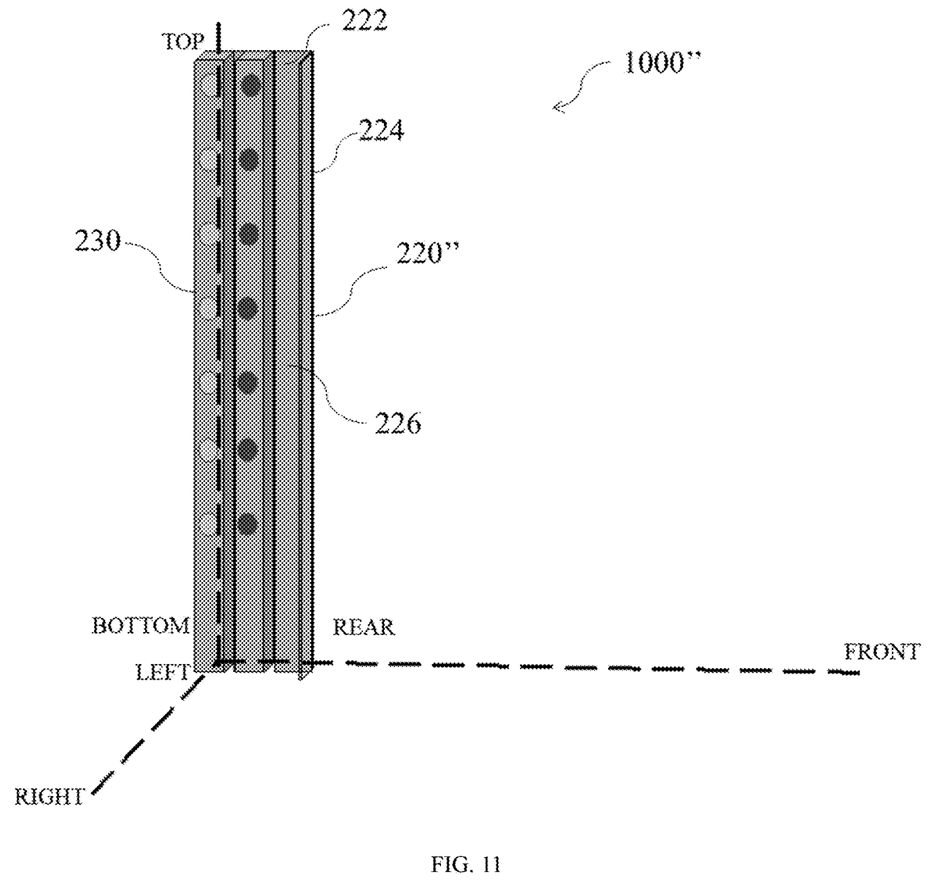
FIG. 11 is a schematic perspective view of a liquid manifold with a locking panel of an apparatus for a data center according to a third embodiment of the present disclosure.

An apparatus 1000" for a data center according to a third embodiment of the present will be described in detail below. With reference to FIG. 11, the apparatus 1000" has substantially the same structure as the apparatus 1000 according to the first embodiment of the present disclosure or the apparatus 1000' according to the second embodiment of the present disclosure, and differs from the apparatus 1000 or 1000' in a modified locking panel 220". The locking panel 220" is fixedly coupled to the liquid manifold 230. The locking panel 220" has a first sub-panel 222 fixedly coupled to the liquid manifold 230 and perpendicular to the left-right direction, and a second sub-panel 224 fixedly coupled to an edge of the first sub-panel 222 away from the liquid manifold 230 and perpendicular to the front-rear direction. The second sub-panel 224 is spaced in front of the liquid manifold 230. That is, a receiving groove 226 is defined between the locking panel 220" and the liquid manifold 230.

When the first and second server connectors 130, 132 are removed from the base panel 140 and the movable panel 150, the movable panel 150 is urged to move leftwards towards the locking panel 220" relative to the base panel 140 by the elastic unit 170, and the locking member 180 can be received in the receiving groove 226.

Since the locking member 180 are received in the receiving groove 226, when the server 100 is removed from the front side of the electronic rack 200 in the front-rear direction, the locking member 180 are stopped by the second sub-panel 224 of the locking panel 220". The locking member 180 is fixedly coupled to the movable panel 150, the movable panel 150 is fixed relative to the base panel 140 in the front-rear direction, and the base panel 140 is fixedly coupled to the chassis 110. Thus, the server 100 is prevented from being uninstalled from the front side of the electronic rack 200.

The locking panel 220" is fixedly provided in the IT space 210 through the liquid manifold 230, thus, infrastructure of the electronic rack 200 does not need to be modified.

The apparatus for the data center according to embodiments of the present disclosure has a high reliable design without introducing any potential new failure point, has no impact on normal operation of the server and rack, and does not need modification no an existing rack design. Thus, the apparatus for the data center according to embodiments of the present disclosure is easy to operate and cost effective.

Furthermore, the apparatus for the data center according to embodiments of the present disclosure is modularly designed to adapt for different types of liquid cooling assemblies for the server, and can accommodate different server and rack configurations, and different dripless fluid connectors.

In the foregoing specification, embodiments of the disclosure have been described with reference to specific exemplary embodiments thereof. It will be evident that various modifications may be made thereto without departing from the broader spirit and scope of the disclosure as set forth in the following claims. The specification and drawings are, accordingly, to be regarded in an illustrative sense rather than a restrictive sense.

As previously explained, an embodiment of the disclosure may be (or include) a non-transitory machine-readable medium (such as microelectronic memory) having stored thereon instructions, which program one or more data processing components (genetically referred to here as a "processor") to perform airflow management operations, such as controlling fan speed of one or more fans of the battery module (and/or BBU shelf). In other embodiments, some of these operations might be performed by specific hardware components that contain hardwired logic. Those operations might alternatively be performed by any combination of programmed data processing components and fixed hardwired circuit components of any of the battery modules described herein.

While certain aspects have been described and shown in the accompanying drawings, it is to be understood that such aspects are merely illustrative of and not restrictive on the broad disclosure, and that the disclosure is not limited to the specific constructions and arrangements shown and described, since various other modifications may occur to those of ordinary skill in the art. The description is thus to be regarded as illustrative instead of limiting.

In some aspects, this disclosure may include the language, for example, "at least one of [element A] and [element B]." This language may refer to one or more of the elements. For example, "at least one of A and B" may refer to "A," "B," or "A and B." Specifically, "at least one of A and B" may refer to "at least one of A and at least one of B," or "at least of either A or B." In some aspects, this disclosure may include the language, for example, "[element A], [element B], and/or [element C]." This language may refer to either of the elements or any combination thereof. For instance, "A, B, and/or C" may refer to "A," "B," "C," "A and B," "A and C," "B and C," or "A, B, and C."

What is claimed is:

1. A server, comprising:
a chassis;
a base panel fixedly coupled to the chassis;
a movable panel coupled to the base panel;
a locking member fixedly coupled to the movable panel;
a liquid cooling assembly provided in the chassis for liquid cooling of the server; and
a server connector and a hose, the server connector being fluidly coupled to the liquid cooling assembly through the hose and configured to be fluidly couplable to a liquid manifold of an electronic rack;
wherein:
the movable panel is movable relative to the base panel in a moving direction between:
an unlocked position where the locking member is configured to be disengaged with a locking panel of the electronic rack, and
a locked position where the locking member is configured to be engaged with the locking panel of the electronic rack,
the server connector is couplable to both of the base panel and the movable panel to prevent the movable panel from moving relative to the base panel,
the server connector comprises a first server connector and a second server connector,
the hose comprises a first hose and a second hose,
the first server connector is coupled to an inlet of the liquid cooling assembly through the first hose and configured to be fluidly couplable to a supply manifold of the liquid manifold of the electronic rack, and
the second server connector is coupled to an outlet of the liquid cooling assembly through the second hose and configured to be fluidly couplable to a return manifold of the liquid manifold of the electronic rack.

2. The server according to claim 1, further comprising an elastic unit preloaded between the base panel and the movable panel to urge the movable panel to move from the unlocked position to the locked position relative to the base panel.

3. The server according to claim 2, wherein the elastic unit is pretensioned between an end of the base panel close to the locking member and an end of the movable panel close to the locking member.

4. The server according to claim 2, wherein the elastic unit is precompressed between an end of the base panel away from the locking member and an end of the movable panel away from the locking member.

5. The server according to claim 1, wherein the locking member comprises an engagement plate fixedly coupled to an end of the movable panel close to the locking panel of the electronic rack.

6. The server according to claim 5, wherein the locking member further comprises a reinforcing rib fixedly coupled to the engagement plate.

7. The server according to claim 6, wherein the two reinforcing ribs are provided, and the two reinforcing ribs extend in the moving direction and spaced apart from each other transversely to the moving direction.

8. The server according to claim 1, wherein the base panel defines a hose channel extending in the moving direction, and the hose passes through the hose channel.

9. The server according to claim 8, further comprising:
a base panel connector holder provided on the base panel; and
a movable panel connector holder provided on the movable panel, wherein:
when in the unlocked position, the base panel connector holder corresponds in position to the movable panel connector holder, and
the server connector is mounted to both of the base panel connector holder and the movable panel connector holder to prevent the movable panel from moving relative to the base panel.

10. The server according to claim 9, wherein the base panel connector holder is provided at the hose channel, and the movable panel connector holder is provided at an end of the movable panel away from the locking member.

11. The server according to claim 9, wherein the movable panel defines a hole corresponding in position to the hose channel, the server connector and the hose pass through the hose channel and the hole sequentially.

12. An electronic rack, comprising:
a server slot configured to receive a server in an extending direction of the server slot; and
a fixed locking panel,
wherein the locking panel is configured to engage with a locking member of the server to prevent the server from being detached from the electronic rack in the extending direction of the server slot,
a fixed liquid manifold comprising a supply manifold configured to supply cooling liquid to the server and a return manifold configured to return warmer liquid from the server,
wherein:
the locking panel is fixedly coupled to the liquid manifold,
the locking panel comprises a first sub-panel coupled to the liquid manifold and a second sub-panel fixedly coupled to an edge of the first sub-panel and is spaced apart from the liquid manifold to define a receiving groove configured to receive the locking member of the server to prevent the server from being detached from the electronic rack, and
the first sub-panel and the second sub-panel are each a flat plate and perpendicular to each other.

13. The electronic rack according to claim 12, wherein the locking panel defines a receiving groove, and the receiving groove is configured to receive the locking member of the server to prevent the server from being detached from the electronic rack.

14. The electronic rack according to claim 12, wherein the locking panel faces the extending direction of the server slot.

15. An apparatus for a data center, comprising:
a server comprising:
a chassis,
a liquid cooling assembly provided in the chassis for liquid cooling of the server,
a server connector and a hose, the server connector being fluidly coupled to the liquid cooling assembly through the hose,
a base panel fixedly coupled to the chassis and defining a hose channel for passage of the hose,
a movable panel coupled to the base panel and movable relative to the base panel in a moving direction, and
a locking member fixedly coupled to the movable panel; and
an electronic rack, the server being inserted into the electronic rack in an insertion direction, and the electronic rack comprising:
a fixed liquid manifold, and
a fixed locking panel fixedly coupled to the fixed liquid manifold,
wherein the movable panel is movable between:
an unlocked position where the locking member is disengaged with the locking panel and the second server connector is mounted to the base panel and the movable panel to prevent the movable panel from moving relative to the base panel, and
a locked position where the locking member is engaged with the locking panel and the server connector is removed from the base panel and the movable panel and fluidly couplable to the liquid manifold.

* * * * *